United States Patent [19]
Anzaki et al.

[11] Patent Number: 6,014,196
[45] Date of Patent: Jan. 11, 2000

[54] TRANSPARENT ELECTRICALLY CONDUCTIVE FILM-ATTACHED SUBSTRATE

[75] Inventors: Toshiaki Anzaki; Hideaki Saitoh, both of Osaka, Japan

[73] Assignee: Nippon Sheet Glass Co., Ltd., Osaka, Japan

[21] Appl. No.: 08/819,030

[22] Filed: Mar. 17, 1997

[30] Foreign Application Priority Data

Apr. 10, 1996 [JP] Japan .................................. 8-087785

[51] Int. Cl.⁷ .................................................. G02F 1/1335
[52] U.S. Cl. .............................................................. 349/137
[58] Field of Search ..................................... 349/139, 140, 349/148, 137, 138, 149, 150

[56] References Cited

U.S. PATENT DOCUMENTS 5,847,795  12/1998  Satoh et al. ............................ 349/137

FOREIGN PATENT DOCUMENTS 499620   3/1992  Japan .
7114841  5/1995  Japan .

*Primary Examiner*—Frank G. Font
*Assistant Examiner*—Tu T. Nguyen
*Attorney, Agent, or Firm*—Sughrue, Mion, Zinn, Macpeak & Seas, PLLC

[57] ABSTRACT

A transparent electrically conductive film is attached to a transparent substrate of a display element. This laminated structure comprises a transparent substrate and has successively laminated on one surface thereof an ITO layer as a first reflection preventing layer, a silver layer, and an ITO layer as a second reflection preventing layer, from the substrate side, wherein the silver layer contains from 0.2 to less than 3.0% by weight of palladium, from 0.2 to less than 5.0% by weight of gold, or from 0.2 to less than 5.0% by weight of platinum. The transparent electrically conductive film formed on the transparent substrate has a low resistance, a high visible light transmittance, and high moisture and heat resistances, and the substrate having the transparent electrically conductive film is particularly suitable for use in a liquid crystal display.

22 Claims, 1 Drawing Sheet

TRANSPARENT ELECTRICALLY CONDUCTIVE FILM-ATTACHED SUBSTRATE

FIELD OF THE INVENTION

The present invention relates to a transparent electrically conductive film-attached substrate which is used for thin display element such as a liquid crystal display element or a plasma display element. More specifically, it relates to a transparent electrically conductive film-attached substrate which is suitably used for a liquid crystal display element having a large area and a high precision, and showing a high-speed response.

BACKGROUND OF THE INVENTION

Hitherto, as a transparent electrically conductive film-attached substrate used for a liquid crystal element, an element obtained by coating the surface of a glass substrate with tin-containing indium oxide (indium oxide doped with a small amount of tin; hereinafter referred to as "ITO") is used. The transparent electrode formed by pattering an ITO transparent electrically conductive film in a definite form is excellent in the transparency to visible light. However, since the transparent electrically conductive film has a large resistivity of an order of $10^{-4}$ $\Omega$cm, there are problems the surface area must be increased, and for realizing a high precision and a high-speed response of a display, the thickness of the transparent electrode must be increased.

However, if the thickness of the transparent electrically conductive film decreases, it becomes difficult to form an electrode having a minute form with a good yield, and also since a remarkable difference in level is formed in the inside of a liquid crystal display by the transparent electrode, there is a problem that an inferior orientation occurs at a surrounding portion of the different level in the orientation treatment of a liquid crystal by rubbing, etc.

To overcome this problem, a transparent electrode of a three-layer structure comprising a silver thin layer having a low resistivity as an electrically conductive layer, the silver thin layer being sandwiched with ITO layers, in order to improve the transparency, is disclosed as a transparent electrode for a liquid crystal display in JP-A-114841 (the term "JP-A" as used herein means an "unexamined published Japanese patent application").

The conventional technique of using the thin film of silver (Ag) for an electrically conductive layer achieves a transparency (high visible light transmittance) and a low resistance characteristics together, but since a water resistance of silver is greatly low, there is a problem that when water enters from a crack of the film, the silver layer deteriorates by corrosion.

SUMMARY OF THE INVENTION

The present invention has been made to overcome the problem described above.

Accordingly, an object of the present invention is to provide a transparent electrically conductive film-attached substrate which can overcome the problems involved in the prior art.

According to a first embodiment of the present invention, there is provided a transparent electrically conductive film-attached substrate for a display element, comprising a transparent substrate and having formed on one surface thereof a transparent electrically conductive film, wherein the transparent electrically conductive film is formed by successively laminating a first reflection preventing layer, a metal layer, and a second reflection preventing layer, from the substrate side, and the metal layer is a layer comprising silver as the main component and 0.2 to less than 3.0% by weight of palladium.

According to a second embodiment of the present invention, there is provided a transparent electrically conductive film-attached substrate for a display element, comprising a transparent substrate and having formed on one surface thereof a transparent electrically conductive film, wherein the transparent electrically conductive film is formed by successively laminating a first reflection preventing layer, a metal layer, and a second reflection preventing layer, from the substrate side, and the metal layer is a layer comprising silver as the main component and 0.2 to less than 5.0% by weight of gold.

According to a third embodiment of the present invention, there is provided a transparent electrically conductive film-attached substrate for a display element, comprising a transparent substrate and having formed on one surface thereof a transparent electrically conductive film, wherein the transparent electrically conductive film is formed by successively laminating a first reflection preventing layer, a metal layer, and a second reflection preventing layer, from the substrate side, and the metal layer is a layer comprising silver as the main component and 0.2 to less than 5.0% by weight of platinum.

DETAILED DESCRIPTION OF THE INVENTION

Figure 1:
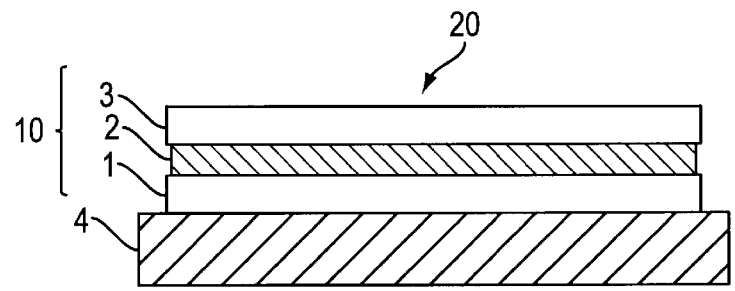
FIG. 1 is a cross-sectional view showing one example of the transparent electrically conductive film-attached substrate of the present invention.

The present invention is described in detail below.

Weight percents of palladium, gold and platinum used herein are based on the weight of the sum of silver and palladium, the weight of the sum of silver and gold, and the weight of the sum of silver and platinum, respectively.

The transparent substrate which can be used in the first embodiment of the present invention is not only conventional glass substrates such as a soda lime silica glass, a borosilicate glass (non-alkali glass), etc., but also a substrate or film of a plastic such as polyethylene terephthalate (PET), polymethyl methacrylate (PMMA), etc., and a substrate obtained by forming on the surface of each of the substrates described above a color filter for the purpose of a color display. Further, those substrates are not necessary to have a flat surface, but may have a certain curved surface.

In the first embodiment of the present invention, it is preferred that the thickness of the first reflection preventing layer is 10 to 200 nm, the thickness of the metal layer comprising silver as the main component is 5 to 100 nm, and the thickness of the second reflection preventing layer is 10 to 200 nm, to ensure the transparency to visible light and a low sheet resistance.

The metal layer comprising silver as the main component in the first embodiment of the present invention contains 0.2 to less than 3.0% by weight of palladium. If palladium is contained in such amount, the moisture resistance and the heat resistance of the transparent electrically conductive film can be improved without greatly decreasing the electric resistance of the film. Also, the volume resistivity of the metal layer is preferably 10 $\mu\Omega$cm or less.

If the content of palladium is less than 0.2% by weight, the improving action to the water resistance of the silver layer is greatly weakened, and if the content of palladium is 3.0% by weight or more, a specific resistance of the silver layer exceeds 10 $\mu\Omega$cm greatly. Further, in addition to palladium, other noble metals such as gold or platinum can be added to the silver layer. In this case, it is preferred that the sum of all the noble metals other than silver is 0.2 to 7% by weight based on the weight of the sum of silver and all the noble metals from the standpoint of maintaining low the specific resistance of the silver layer.

A method of forming the palladium-containing silver layer can be the conventional method, such as sputtering, an electron beam vapor deposition or ion plating, using a mixed material of silver and palladium. A method such as co-sputtering, an electron beam co-vapor deposition or co-ion plating, from a plurality of vapor generating sources of silver and palladium, can also be used. Further, after formation of the film, the palladium-containing silver layer can be subjected to a heat treatment in air, a neutral atmosphere, a reducing atmosphere, or a vacuum at a temperature of 150 to 250° C. for preferably about 10 minutes or longer, making palladium in silver thermodynamically more stable, so that the moisture and heat resistances of the palladium-containing silver layer can be improved.

There is no particular limitation on the material for forming the first reflection preventing layer in the first embodiment of the present invention so long as the material is a metal oxide which is transparent to visible light. However, from the point of increasing the visible light transmittance of the transparent electrically conductive film, a metal oxide having a reflective index at a wavelength of 550 nm of 1.6 to 2.9 is preferably used. Examples of such a transparent metal oxide which can be used include indium oxide, zinc oxide, tin oxide, neodymium oxide, zirconium oxide, cerium oxide, cadmium oxide, antimony oxide, tantalum pentoxide, bismuth oxide, titanium dioxide, aluminum oxide, a transparent composite oxide comprising mixtures of these metal oxides, electrically conductive transparent metal oxide such as tin-containing indium oxide(ITO), antimony-containing tin oxide or aluminum-containing zinc oxide, and an electrically conductive composite oxide comprising mixtures of them. A mixture of the metal oxide described above and silicon dioxide for controlling the reflective index can also be used.

The second reflection preventing layer in the first embodiment of the present invention preferably is ITO. It is preferred that the second reflection preventing layer is a double layer structure comprising a layer of zinc oxide containing a small amount of aluminum disposed at the substrate side and a layer of ITO disposed at the non-substrate side, in the point of simultaneously obtaining the moisture and heat resistances and an alkali resistance.

The metal layer comprising silver as the main component in the first embodiment of the present invention can be divided to form double layer or more multilayer structures by inserting one or more division layers in the metal layer, whereby the transparent electrically conductive layer having a visible light transmittance higher than that of the metal layer which is not divided can be obtained when the sheet resistance of those layers is almost the same. Where the metal layer is divided, it is preferred that the sum of the thicknesses of the divided metal layers is about 100 nm or less in order that the perpendicular visible light transmittance of the entire transparent electrically conductive film-attached substrate of the present invention is 50% or higher.

For example, if the metal layer is divided into two layers with one ITO layer (the number of division layer n=1), a transparent electrically conductive film having a small sheet resistance can be obtained without greatly decreasing the visible light transmittance. If the metal layer is divided into three layers with two ITO layers (n=2), a transparent electrically conductive film having a low sheet resistance can be obtained while maintaining a high visible light transmittance. The number of n is preferably 1 to 3. If n is 4 or more, which divides the metal layer into 5 or more layer, it is difficult to satisfy both low resistance and high transmittance from the relationship of the thickness of the metal layer and specific resistance.

The division layer(s) and the reflection preventing layers in the first embodiment of the present invention can be formed by a conventional vacuum thin-film formation method such as sputtering, a vacuum vapor deposition or ion plating.

The transparent substrate which can be used in the second embodiment of the present invention is not only conventional glass substrates such as a soda lime silica glass or a borosilicate glass (non-alkali glass), but also a substrate or film of a plastic such as polyethylene terephthalate (PET) or polymethyl methacrylate (PMMA), and a substrate obtained by forming on the surface of each of the substrates described above a color filter for the purpose of color filter as in the first embodiment of the present invention. These substrates are not necessary flat, but may have a certain curved surface.

In the second embodiment of the present invention, it is preferred that the thickness of the first reflection preventing layer is 10 to 200 nm, the thickness of the metal layer comprising silver as the main component is 5 to 100 nm, and the thickness of the second reflection preventing layer is 10 to 200 nm, for ensuring the transparency to visible light and a low sheet resistance.

The metal layer comprising silver as the main component in the second embodiment of the present invention contains 0.2 to less than 5.0% by weight of gold, whereby the moisture and heat resistances of the transparent electrically conductive film is improved without greatly decreasing the electric resistance. In this case, the volume resistivity of the metal layer preferably is 10 $\mu\Omega$cm or less. If the content of gold is less than 0.2% by weight, the improving action to the water resistance of the silver layer is weakened, and if the content of palladium is 5.0% by weight or more, the specific resistance of the silver layer exceeds 10$\mu\Omega$cm greatly. In addition to gold, other noble metal such as platinum or palladium can be added to the silver layer. In this case, it is preferred that the sum of all the noble metals other than silver is 0.2 to 7.0% by weight from the standpoint of maintaining low the specific resistance of the silver layer.

A method of forming the gold-containing silver layer, which can be used is the conventional method such as sputtering, an electron beam vapor deposition or ion plating, using a mixed material of silver and gold. A method of co-sputtering, an electron beam co-vapor deposition, or co-ion plating from a plurality of vapor generating sources of silver and gold can also be used. After formation of film, the gold-containing silver layer is subjected to a heat treatment in air, a neutral atmosphere, a reducing atmosphere, or a vacuum at a temperature of from 150 to 250° C. for preferably about 10 minutes or more, making gold in silver thermodynamically more stable, so that the moisture and heat resistances of the gold-containing silver layer can be improved.

There is no particular limitation on the material for forming the first reflection preventing layer in the second embodiment of the present invention so long as the material is a metal oxide which is transparent to visible light. However, from the point of increasing the visible light transmittance of the transparent electrically conductive film, a metal oxide having a reflective index at a wavelength of 550 nm of 1.6 to 2.9 is preferably used. Examples of such a transparent metal oxide which can be used include indium oxide, zinc oxide, tin oxide, neodymium oxide, zirconium oxide, cerium oxide, cadmium oxide, antimony oxide, tantalum pentoxide, bismuth oxide, titanium dioxide, aluminum oxide, a transparent composite oxide comprising mixtures of these metal oxides, electrically conductive transparent metal oxide such as ITO, antimony-containing tin oxide or aluminum-containing zinc oxide, and an electrically conductive composite oxide comprising mixtures of them. A mixture of the metal oxide described above and silicon dioxide for controlling the reflective index can also be used.

The second reflection preventing layer in the second embodiment of the present invention preferably is ITO. It is also preferred that the second reflection preventing layer is a double layer structure comprising a layer of zinc oxide containing a small amount of aluminum disposed at the substrate side and a layer of ITO disposed at the non-substrate side from the point of simultaneously obtaining the moisture and heat resistances and an alkali resistance.

The metal layer comprising silver as the main component in the second embodiment of the present invention can be divided to form a double layer or more multilayer structure by inserting one or more division layer in the metal layer as in the first embodiment of the present invention. By employing such an embodiment, the transparent electrically conductive layer having a visible light transmittance than that of the metal layer which is not divided can be obtained when the area resistance of those layers is almost the same.

The division layer(s) and the reflection preventing layers in the second embodiment of the present invention can be formed by a conventional vacuum thin-film forming method such as sputtering, a vacuum vapor deposition or ion plating.

The transparent substrate which can be used in the third embodiment of the present invention can be the same substrates as used in the first and second embodiments of the present invention.

In the third embodiment of the present invention, it is preferred that the thickness of the first reflection preventing layer is 10 to 200 nm, the thickness of the metal layer comprising silver as the main component is 5 to 100 nm, and the thickness of the second reflection preventing layer is 10 to 200 nm, for ensuring the transparency to visible light and a low sheet resistance.

The metal layer comprising silver as the main component in the third embodiment of the present invention contains 0.2 to less than 5.0% by weight of platinum, whereby the moisture and heat resistances of the transparent electrically conductive film is improved without greatly decreasing the electric resistance. In this case, it is preferred that the volume resistivity of the metal layer is 10 $\mu\Omega$cm or less.

If the content of platinum is less than 0.2% by weight, the improving action to the water resistance of the silver layer is greatly weakened, and if the content of platinum is 5.0% by weight or more, the specific resistance of the silver layer exceeds 10 $\mu 106$ cm greatly. In addition to platinum, other noble metal such as gold or palladium can be added to the silver layer. In this case, it is preferred that the sum of all the noble metals other than silver is 0.2 to 7.0% by weight based on the weight of the sum of silver and all the noble metals from the standpoint that the specific resistance of the silver layer does not greatly deteriorate.

A method of forming the platinum-containing silver layer, which can be used is the conventional method such as sputtering, an electron beam vapor deposition or ion plating, using a mixed material of silver and platinum. A method of co-sputtering, an electron beam co-vapor deposition or co-ion plating from a plurality of vapor generating sources of silver and platinum can also be used. After formation of the film, the platinum-containing silver layer is subjected to a heat treatment in air, a neutral atmosphere, a reducing atmosphere, or a vacuum at a temperature of 150 to 250° C. for about 10 minutes or more, making platinum in silver thermodynamically more stable, so that the moisture and heat resistances of the platinum-containing silver layer can be improved.

There is no particular limitation on the material for forming the first reflection preventing layer in the third embodiment of the present invention so long as the material is a metal oxide which is transparent to visible light. However, from the point of increasing the visible light transmittance of the transparent electrically conductive film, a metal oxide having a reflective index at a wavelength of 550 nm of 1.6 to 2.9 is preferably used. Examples of such a transparent metal oxide which can be used include indium oxide, zinc oxide, tin oxide, neodymium oxide, zirconium oxide, cerium oxide, cadmium oxide, antimony oxide, tantalum pentoxide, bismuth oxide, titanium dioxide, aluminum oxide, a transparent composite oxide comprising mixtures of these metal oxides, electrically conductive transparent metal oxide such as ITO, antimony-containing tin oxide or aluminum-containing zinc oxide, and an electrically conductive composite oxide comprising mixtures of them. A mixture of the metal oxide described above and silicon dioxide for controlling the reflective index can also be used.

The second reflection preventing layer in the third embodiment of the present invention preferably is ITO. Also, it is preferred that the second reflection preventing layer is a double layer structure comprising a layer of zinc oxide containing a small amount of aluminum disposed at the substrate side and a layer of ITO disposed at the non-substrate side from the point of simultaneously obtaining the moisture and heat resistances and an alkali resistance.

The metal layer comprising silver as the main component in the third embodiment of the present invention can be divided to form double layer or more multilayer structures by inserting one or more division layers in the metal layer, whereby the transparent electrically conductive layer having a visible light transmittance higher than that of the metal layer which is not divided can be obtained when the sheet resistance of those layers is almost the same.

The division layer(s) and the reflection preventing layers in the third embodiment of the present invention can be formed by a conventional vacuum thin-film forming method such as sputtering, a vacuum vapor deposition or ion plating.

Regarding the characteristics of the noble metal component added to the metal layer, palladium is excellent in that palladium is soluble in nitric acid and is inexpensive, and gold and platinum are particularly excellent in the function for improving the corrosion resistance.

Two transparent electrically conductive film-attached substrates are adhered at the marginal portions of them with an adhesive such that the transparent electrically conductive films face each other to form a closed space between the substrates, and a liquid crystal is enclosed in the closed space to prepare a liquid crystal display element. When the transparent electrically conductive film-attached substrate of the present invention is used as at least one of the substrates of the above liquid crystal display element, a high-precise and bright liquid crystal display element can be obtained.

The embodiments of the present invention are described practically below by referring to the accompanying drawings.

Figure 2:
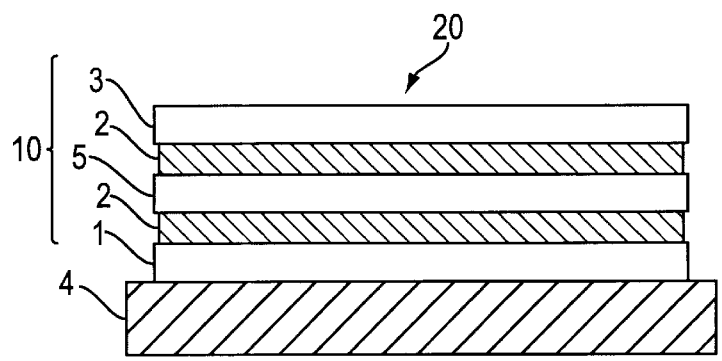
FIG. 2 is a cross-sectional view showing another example of the transparent electrically conductive film-attached substrate of the present invention.
Figure 3:
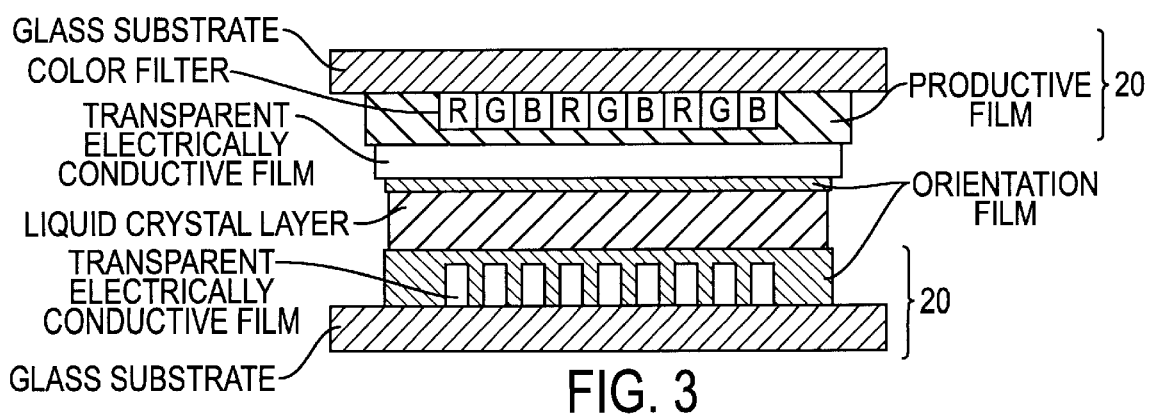
FIG. 3 is a schematic view of a liquid crystal display for explaining an use example of the transparent electrically conductive film-attached substrate of the present invention.

FIG. 1 is a cross-sectional view showing one example of the present invention, wherein a transparent electrically conductive film-attached substrate 10 is constituted by laminating a first reflection preventing layer 1, a metal layer 2, and a second reflection preventing layer 3 on the surface of a transparent substrate 4, in this order. FIG. 2 is a cross-sectional view showing another example of the present invention, wherein a first reflection preventing layer 1, a metal layer 2, and a second reflection preventing layer 3 are laminated on the surface of a transparent substrate, in this order, and the metal layer 2 is divided into 2 layers by a division layer 5. The number of the division layer(a) is usually 1 or 2 and the metal layer is frequently divided into 2 or 3 layers. However, where lower resistance is required, 3 or more division layers are provided, whereby the metal layer is divided into 4 or more layers. FIG. 3 is a schematic view showing a liquid crystal display element for explaining the use example of the transparent electrically conductive element-attached substrate of the present invention.

The particularly preferred embodiments of the present invention are described below. To obtain the characteristics of a sheet resistance of about 1.5 to 2.5 Ω/□ and a visible light transmittance of 60% or higher, a laminate structure comprises a glass substrate, an ITO layer having a thickness of 30 to 70 nm, a metal layer comprising 98% by weight of silver and 2% by weight of palladium having a thickness of 5 to 20 nm, an ITO layer having a thickness of 60 to 110 nm, a metal layer comprising 98% by weight of silver and 2% by weight of palladium having a thickness of 5 to 20 nm, an ITO layer having a thickness of 30 to 70 nm. To obtain the characteristics of a sheet resistance of 1.5 Ω/□ or lower and a visible light transmittance of 60% or higher, a laminate structure comprises a glass substrate, an ITO layer having a thickness of 30 to 70 nm, a metal layer comprising 98% by weight of silver and 2% by weight of palladium having a thickness of 10 to 30 nm, an ITO layer having a thickness of 60 to 110 nm, a metal layer comprising 98% by weight of silver and 2% by weight of palladium having a thickness of 10 to 30 nm, an ITO layer having a thickness of 60 to 110 nm, a metal layer comprising 98% by weight of silver and 2% by weight of palladium having a thickness of 10 to 30 nm, an ITO layer having a thickness of 30 to 70 nm.

The results of measuring the moisture and heat resistances evaluated by exposing to a high-temperature high-humidity atmosphere for a definite time, the transparency evaluated by the height of the visible light transmittance including the substrate, the electric characteristics evaluated by the lowness of the sheet resistance, and the electrode workability evaluated by the easiness of etching and the uniformity of the surface subjected to etching are shown in the following examples.

EXAMPLE 1

A glass substrate of a soda lime silica composition for a simple matrix liquid crystal display having a length of 400 mm, a width of 300 mm, and a thickness of 0.7 mm was washed with pure water, and silicon dioxide for an alkali passivation was then formed on both sides thereof at a thickness of 30 nm. Using indium oxide containing 10% by weight of tin oxide (for formation of ITO layers) and a mixed metal composed of 99% by weight of silver and 1% by weight of palladium (for formation of a metal layer) as sputtering targets, an ITO layer/a metal layer (substantially composed of a composition of about 99% by weight of silver and 1% by weight of palladium)/an ITO layer were successively formed on the silicon dioxide layer formed on the glass substrate at the thicknesses of 42 nm, 15 nm and 38 nm, respectively, by a DC sputtering method to obtain a transparent electrically conductive film-attached glass substrate (sample 1). The characteristics of the sample 1 thus obtained are shown in the Table below.

A pattern working of electrode was applied to the transparent electrically conductive film of the sample 1 with an etching liquid composed of an aqueous solution containing hydrochloric acid and nitric acid as acids such that a stripe-form transparent electrode having each electrode width of 70 μm and an interval between the electrodes of 15 μm was formed. As a result, a good pattern was obtained.

EXAMPLE 2

A glass substrate of a soda lime silica composition for a simple matrix liquid crystal display having a length of 400 mm, a width of 300 mm, and a thickness of 0.7 mm was washed with pure water, and silicon dioxide for an alkali passivation was then formed on both sides thereof at a thickness of 30 nm. Using indium oxide containing 10% by weight of tin oxide (for formation of ITO layers) and a mixed metal composed of 99% by weight of silver and 1% by weight of palladium (for formation of metal layers) as sputtering targets, an ITO layer/a metal layer (substantially composed of a composition of about 99% by weight of silver and 1% by weight of palladium)/an ITO layer/a metal layer/an ITO layer were successively formed on the silicon dioxide layer formed on the glass substrate at the thicknesses of 41 nm, 15 nm, 81 nm, 15 nm and 39 nm, respectively, by a DC sputtering method to obtain a transparent electrically conductive film-attached glass substrate (sample 2). The characteristics of the sample 2 thus obtained are shown in the Table below.

A pattern working of electrode was applied to the transparent electrically conductive film of the sample 2 with an etching liquid composed of an aqueous solution containing hydrochloric acid and nitric acid as acids such that a stripe-form transparent electrode having each electrode width of 70 μm and an interval between the electrodes of 15 μm was formed. As a result, a good pattern was obtained.

EXAMPLE 3

Example 2 was followed except that the target forming the metal layer was changed to a metal composed of 98% by weight of silver and 2% by weight of gold and the thickness of each ITO layer was optimized in regard to the optical characteristics so as to obtain the highest transmittance, to thereby obtain a transparent electrically conductive film-attached glass substrate of a 5 layer structure (sample 3). The characteristics of the sample 3 thus obtained are shown in the Table below.

A pattern working of electrode was applied to the transparent electrically conductive film of the sample 3 with an etching liquid composed of an aqueous solution containing hydrochloric acid and nitric acid as acids such that a stripe-form transparent electrode having each electrode width of 70 μm and interval between the electrodes of 15 μm was formed. As a result, a good pattern was obtained.

EXAMPLE 4

Example 2 was followed except that the target forming the metal layer was changed to a metal composed of 98% by weight of silver and 2% by weight of platinum and the thickness of each ITO layer was optimized in regard to the optical characteristics so as to obtain the highest transmittance, to thereby obtain a transparent electrically conductive film-attached glass substrate of a 5 layer structure (sample 4). The characteristics of the sample 4 thus obtained are shown in the Table below.

A pattern working of electrode was applied to the transparent electrically conductive film of the sample 4 with an etching liquid composed of an aqueous solution containing hydrochloric acid and nitric acid as acids such that a stripe-form transparent electrode having each electrode width of 70 μm and interval between the electrodes of 15 μm was formed. As a result, a good pattern was obtained.

EXAMPLE 5

A glass substrate of a soda lime silica composition for a simple matrix liquid crystal display having a length of 550 mm, a width of 400 mm, and a thickness of 0.7 mm was washed with pure water, and silicon dioxide for an alkali passivation was then formed on both sides thereof at a thickness of 30 nm. Using indium oxide containing 10% by weight of tin oxide (for formation of ITC layers) and a mixed metal composed of 99% by weight of silver and 1% by weight of palladium (for formation of metal layers) as sputtering targets, an ITO layer/a metal layer (about 99% by weight of silver and 1% by weight of palladium)/an ITO layer/a metal layer/an ITO layer were successively formed on the silicon dioxide layer formed on the glass substrate at the thicknesses of 45 nm, 17 nm, 90 nm, 22 nm and 43 nm, respectively, by a DC sputtering method to obtain a transparent electrically conductive film-attached glass substrate (sample 5). The characteristics of the sample 5 thus obtained are shown in the Table below.

A pattern working of electrode was applied to the transparent electrically conductive film of the sample 5 with an etching liquid composed of an aqueous solution containing hydrochloric acid and nitric acid as acids such that a stripe-form transparent electrode having each electrode width of 70 μm and an interval between the electrodes of 15 μm was formed. The substrate having formed thereon the stripe-form transparent electrode was then subjected to a heat treatment in air at a temperature of 230° C. for 30 minutes. As a result, the resistance of the film was improved about 30%.

EXAMPLE 6

A glass substrate of a soda lime silica composition for a simple matrix liquid crystal display having a length of 550 mm, a width of 400 mm, and a thickness of 0.7 mm was washed with pure water, and silicon dioxide for an alkali passivation was formed on both sides thereof at a thickness of 30 nm. Using indium oxide containing 10% by weight of tin oxide (for formation of ITO layers) and a mixed metal composed of 98% by weight of silver and 2% by weight of palladium (for formation of metal layers) as sputtering targets, an ITO layer/a metal layer (about 98% by weight of silver and 2% by weight of palladium)/an ITO layer/a metal layer/an ITO layer were successively formed on the silicon dioxide layer formed on the glass substrate at the thicknesses of 46 nm, 23 nm, 91 nm, 18 nm and 44 nm, respectively, by a DC sputtering method to obtain a transparent electrically conductive film-attached glass substrate (sample 6).

A pattern working of electrode was applied to the transparent electrically conductive film of the sample 6 with an etching liquid composed of an aqueous solution containing hydrochloric acid and nitric acid as acids such that a stripe-form transparent electrode having each electrode width of 70 μm and an interval between the electrodes of 15 μm was formed. The substrate having formed thereon the stripe-form transparent electrode was subjected to a heat treatment in air at a temperature of 230° C. for 30 minutes. As a result, the resistance of the film was improved about 30%.

Comparative Example 1

Example 1 was followed except that 100% silver was used as the sputtering target for forming the metal layer, to obtain a comparative sample (1). The characteristics of the sample (1) are shown in the Table below.

Comparative Example 2

Example 2 was followed except that 100% silver was used as the sputtering target for forming the metal layer, to obtain a comparative sample (2). The characteristics of the sample (2) are shown in the Table below.

TABLE

| Sample | Structure of Electrode Film[*1] Film thickness (nm) | Sheet Resistance ($\Omega/\square$) | Transmittance[*2] (%) | Moisture and Heat Resistances[*3] |
|---|---|---|---|---|
| 1 | ITO/Ag-Pd1%/ITO 42/15/38 | 2.7 | 88 | Good |
| 2 | ITO/Ag-Pd1%/ITO/Ag-Pd1%/ITO 41/15/81/15/39 | 1.7 | 78 | Good |
| 3 | ITO/Ag-Au2%/ITO/Ag-Au2%/ITO 42/15/82/15/38 | 1.8 | 76 | Good |
| 4 | ITO/Ag-Pt2%/ITO/Ag-Pt2%/ITO 41/15/81/15/38 | 1.8 | 76 | Good |
| 5 | ITO/Ag-Pd1%/ITO/Ag-Pd1%/ITO 45/17/90/22/43 | 1.4 | 75 | Good |
| 6 | ITO/Ag-Pd2%/ITO/Ag-Pd2%/ITO 46/23/91/18/44 | 1.5 | 74 | Good |
| (1) | ITO/Ag/ITO 42/15/48 | 2.6 | 88 | Corrosion of Ag occurred. |
| (2) | ITO/Ag/ITO/Ag/ITO 41/15/81/15/39 | 1.6 | 78 | Corrosion of Ag occurred. |

Notes:
[*1]The left side is the substrate side.
[*2]The value of the transmittance at 550 nm including the soda lime glass substrate.
[*3]Exposed under the conditions of 90% RH at 60° C. for 24 hours It can be seen from the above results that the substrates according to the examples of the present invention are excellent in the moisture and heat resistances as compared with the substrates according to the comparative examples.

Since the silver layer which ensures the electric conductivity of the transparent electrically conductive film-attached substrate of the present invention contains palladium, gold, or platinum at a definite concentration, a transparent electrically conductive film-attached substrate having a low resistance, a high visible light transmittance, and high moisture and heat resistances can be obtained.

Also, by using the transparent electrically conductive film-attached substrate of the present invention, a display of a large picture having an excellent durability and a high image quality can be obtained.

While the invention has been described in detail and with reference to specific embodiments thereof, it will be apparent to one skilled in the art that various changes and modifications can be made therein without departing from the spirit and scope thereof.

What is claimed is:

1. A transparent electrically conductive film and attached substrate of a display element, comprising a transparent substrate and having formed on one surface thereof an electrically conductive film, wherein the transparent electrically conductive film is formed by successively laminating a first reflection preventing layer, a metal layer, and a second reflection preventing layer, from the substrate side, and the metal layer is a layer comprising silver as the main component and 0.2 to less than 3.0% by weight of palladium.

2. The transparent electrically conductive film and attached substrate of a display element as claimed in claim 1, wherein the first reflection preventing layer is a layer of a transparent metal oxide having a reflection index at a wavelength of 550 nm of 1.6 to 2.9, and the second reflection preventing layer is a tin-containing indium oxide layer.

3. The transparent electrically conductive film and attached substrate of a display element as claimed in claim 1, wherein the first reflection preventing layer is a layer of a transparent metal oxide having a reflection index at a wavelength of 550 nm of 1.6 to 2.9, and the second reflection preventing layer is a double layer comprising an aluminum-containing zinc oxide layer at the substrate side and a tin-containing indium oxide layer at the non-substrate side.

4. The transparent electrically conductive film and attached substrate of a display element as claimed in claim 1, wherein the metal layer is divided into n+1 (wherein n is an integer of 1 of more) layer from the layer adjacent to the substrate side to a far layer therefrom by n of division layer(s), and the each division layer is a layer of the same material as the material forming the first reflection preventing layer or the second reflection preventing layer.

5. The transparent electrically conductive film and attached substrate of a display element as claimed in claim 1, wherein a color filter is provided between the substrate and the transparent electrically conductive film.

6. The transparent electrically conductive film and attached substrate of a display element as claimed in claim 1, wherein the first reflection prevention layer has a thickness of 10 to 200 nm, the metal layer has a thickness of 5 to 100 nm and a volume resistivity of 10 $\mu\Omega$cm or less, and the second reflection preventing layer has a thickness of 10 to 200 nm.

7. The transparent electrically conductive film and attached substrate of a display element as claimed in claim 6 having a visible light transmittance of 60% or higher.

8. A transparent electrically conductive film and attached substrate of a display element, comprising a transparent substrate and having formed on one surface thereof an electrically conductive film, wherein the transparent electrically conductive film is formed by successively laminating a first reflection preventing layer, a metal layer, and a second reflection preventing layer, from the substrate side, and the metal layer is a layer comprising silver as the main component and 0.2 to less than 5.0% by weight of gold.

9. The transparent electrically conductive film and attached substrate of a display element as claimed in claim 8, wherein the first reflection preventing layer is a layer of a transparent metal oxide having a reflection index at a wavelength of 550 nm of 1.6 to 2.9, and the second reflection preventing layer is a tin-containing indium oxide layer.

10. The transparent electrically conductive film and attached substrate of a display element as claimed in claim 8, wherein the first reflection preventing layer is a layer of a transparent metal oxide having a reflection index at a wavelength of 550 nm of 1.6 to 2.9, and the second reflection preventing layer is a double layer comprising an aluminum-containing zinc oxide layer at the substrate side and a tin-containing indium oxide layer at the non-substrate side.

11. The transparent electrically conductive film and attached substrate of a display element as claimed in claim 8, wherein the metal layer is divided into n+1 (wherein n is an integer of 1 of more) layer from the layer adjacent to the substrate side to a far layer therefrom by n of division layer(s), and the each division layer is a layer of the same material as the material forming the first reflection preventing layer or the second reflection preventing layer.

12. The transparent electrically conductive film and attached substrate of a display element as claimed in claim 8, wherein a color filter is provided between the substrate and the transparent electrically conductive film.

13. The transparent electrically conductive film and attached substrate of a display element as claimed in claim 8 wherein the first reflection prevention layer has a thickness of 10 to 200 nm, the metal layer has a thickness of 5 to 100 nm and a volume resistivity of 10 $\mu\Omega$cm or less, and the second reflection preventing layer has a thickness of 10 to 200 nm.

14. A transparent electrically conductive film and attached substrate of a display element, comprising a transparent substrate and having formed on one main surface thereof an electrically conductive film, wherein the transparent electrically conductive film is formed by successively laminating a first reflection preventing layer, a metal layer, and a second reflection preventing layer, from the substrate side, and the metal layer is a layer comprising silver as the main component and 0.2 to less than 5.0% by weight of platinum.

15. The transparent electrically conductive film and attached substrate of a display element as claimed in claim 14, wherein the first reflection preventing layer is a layer of a transparent metal oxide having a reflection index at a wavelength of 550 nm of 1.6 to 2.9, and the second reflection preventing layer is a tin-containing indium oxide layer.

16. The transparent electrically conductive film and attached substrate of a display element as claimed in claim 14, wherein the first reflection preventing layer is a layer of a transparent metal oxide having a reflection index at a wavelength of 550 nm of 1.6 to 2.9, and the second reflection preventing layer is a double layer comprising an aluminum-containing zinc oxide layer at the substrate side and a tin-containing indium oxide layer at the non-substrate side.

17. The transparent electrically conductive film and attached substrate of a display element as claimed in claim 14, wherein the metal layer is divided into n+1 (wherein n is an integer of 1 of more) layer from the layer adjacent to the substrate side to a far layer therefrom by n of division layer(s), and the each division layer is a layer of the same material as the material forming the first reflection preventing layer or the second reflection preventing layer.

18. The transparent electrically conductive film and attached substrate of a display element as claimed in claim 14 wherein a color filter is provided between the substrate and the transparent electrically conductive film.

19. The transparent electrically conductive file and attached substrate of a display element as claimed in claim 14, wherein the first reflection prevention layer has a thickness of 10 to 200 nm, the metal layer has a thickness of 5 to 100 nm and a volume resistivity of 10 $\mu\Omega$cm or less, and the second reflection preventing layer has a thickness of 10 to 200 nm.

20. A liquid crystal display element comprising two glass substrates each having a transparent electrically conductive film attached thereto, said glass substrates being adhered to one another at marginal portions with an adhesive such that the electrically conductive films face each other to form a closed space, wherein one of the two glass substrates further has attached thereto a color filter element for color display, and wherein at least one of said transparent electrically conductive films is formed by successively laminating a first reflection preventing layer, a metal layer, and a second reflection preventing layer, from the substrate side, and the metal layer is a layer comprising silver as the main component and 0.2 to less than 3.0% by weight of palladium.

21. A liquid crystal display element comprising two glass substrates each having a transparent electrically conductive film attached thereto, said glass substrates being adhered to one another at marginal portions with an adhesive such that the electrically conductive films face each other to form a closed space, wherein one of the two glass substrates further has attached thereto a color filter element for color display, and wherein at least one of said transparent electrically conductive films is formed by successively laminating a first reflection preventing layer, a metal layer, and a second reflection preventing layer, from the substrate side, and the metal layer is a layer comprising silver as the main component and 0.2 to less than 5.0% by weight of gold.

22. A liquid crystal display element comprising two glass substrates each having a transparent electrically conductive film attached thereto, said glass substrates being adhered to one another at marginal portions with an adhesive such that the electrically conductive films face each other to form a closed space, wherein one of the two glass substrates further has attached thereto a color filter element for color display, and wherein at least one of said transparent electrically conductive films is formed by successively laminating a first reflection preventing layer, a metal layer, and a second reflection preventing layer, from the substrate side, and the metal layer is a layer comprising silver as the main component and 0.2 to less than 5.0% by weight of platinum.

* * * * *